(12) United States Patent
Chen et al.

(10) Patent No.: US 8,089,757 B2
(45) Date of Patent: Jan. 3, 2012

(54) WATERPROOF STRUCTURE AND PORTABLE ELECTRICAL APPARATUS USING THE SAME

(75) Inventors: Kuan-Yu Chen, Taipei Hsien (TW); Hsing-Wang Chang, Taipei Hsien (TW); Feng-Hsiung Wu, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 692 days.

(21) Appl. No.: 12/222,880

(22) Filed: Aug. 19, 2008

(65) Prior Publication Data

US 2009/0109635 A1 Apr. 30, 2009

(30) Foreign Application Priority Data

Oct. 26, 2007 (TW) .............................. 96218072 U

(51) Int. Cl.
*G06F 1/16* (2006.01)
*A47B 81/00* (2006.01)
*H02G 3/14* (2006.01)

(52) U.S. Cl. ........... 361/679.56; 361/679.55; 312/223.1; 312/223.2; 174/66; 174/67

(58) Field of Classification Search .......... 361/679.01–679.45, 679.55–679.59; 312/223.1, 223.2

See application file for complete search history.

(56) References Cited

U.S. PATENT DOCUMENTS

| | | | |
|---|---|---|---|
| 6,407,911 B1* | 6/2002 | Spence et al. | 361/679.3 |
| 6,919,510 B1* | 7/2005 | Chen | 174/66 |
| 7,158,376 B2* | 1/2007 | Richardson et al. | 361/679.56 |
| 7,648,043 B2* | 1/2010 | Chen | 220/825 |
| 7,710,714 B2* | 5/2010 | Rapp et al. | 361/679.01 |
| 7,742,294 B2* | 6/2010 | Gadau et al. | 361/679.43 |
| 7,789,437 B2* | 9/2010 | Sheng | 292/137 |
| 2005/0143029 A1* | 6/2005 | Sasaki et al. | 455/128 |
| 2006/0067035 A1* | 3/2006 | Hamada et al. | 361/680 |
| 2008/0125197 A1* | 5/2008 | Hongo et al. | 455/575.3 |
| 2010/0046158 A1* | 2/2010 | Nakatani et al. | 361/679.33 |
| 2011/0075338 A1* | 3/2011 | Tang et al. | 361/679.4 |

* cited by examiner

*Primary Examiner* — Jayprakash N Gandhi
*Assistant Examiner* — Nidhi Desai
(74) *Attorney, Agent, or Firm* — Bacon & Thomas, PLLC

(57) ABSTRACT

A waterproof structure for a housing of a portable electronic apparatus comprises a cover and an elastic pad. The cover comprises a pivot portion, and the cover is connected to the housing via the pivot portion such that the cover is capable of rotating in relation to the housing. The elastic pad comprises at least one protrusion structure, and the at least one protrusion structure is capable of inserting into a waterproof groove on the housing corresponding to the protrusion structure. When the cover is rotated to close the housing, the cover is capable of compressing the elastic pad to form a seal between the at least one protrusion structure and the waterproof groove.

13 Claims, 6 Drawing Sheets

WATERPROOF STRUCTURE AND PORTABLE ELECTRICAL APPARATUS USING THE SAME

BACKGROUND OF THE INVENTION

1. Field of the Invention

The present invention relates to a waterproof structure and a portable electronic apparatus using the same and, more particularly, to a waterproof structure capable of protecting expansion interfaces of a portable electronic apparatus and providing a better sealed effect.

2. Description of the Related Art

A portable electronic apparatus, such as a notebook computer, a mobile phone or a PDA, usually includes a plurality of expansion interfaces for connecting extra external devices or transmission lines. These expansion interfaces are usually uncovered or shielded by a housing which provides basic protection. However, for those users working or acting in a wet environment or in rain, such as firemen, policemen, or soldiers, the basic protection fails to meet their needs. To determine whether a portable electronic apparatus is sustainable in such a tough environment, a universally accepted standard has been set. The standard, which is usually abbreviated as Ingress Protection 67 (IP67), requires that the portable electronic apparatus be impermeable to dust and water to the degrees of six and seven, respectively. In other words, a product that meets the requirement of IP67 is completely dustproof and capable of working one meter underwater; however, most portable electronic apparatuses cannot meet that requirement.

Furthermore, in a portable electronic apparatus conforming to the IP67 standard, the waterproof structure is most commonly fastened by screws. When a user wants to use expansion interfaces, he needs to loosen the screws with a tool, which can be very inconvenient.

Therefore, it is desirable to provide a waterproof structure and a portable electronic apparatus to mitigate and obviate the aforementioned problems.

SUMMARY OF THE INVENTION

A main objective of the present invention is to provide a waterproof structure capable of forming a better seal to protect the expansion interfaces of a portable electronic apparatus in harsh conditions.

Another objective of the present invention is to provide a portable electronic apparatus comprising the waterproof structure.

In order to achieve the above mentioned objective, the waterproof structure for a housing of a portable electronic apparatus of the present invention comprises a cover and an elastic pad. The cover comprises a pivot portion, and the cover is connected to the housing via the pivot portion such that the cover is capable of rotating in relation to the housing. The elastic pad comprises at least one protrusion structure, and the at least one protrusion structure is capable of inserting into a waterproof groove on the housing corresponding to the protrusion structure. When the cover is rotated to close the housing, the cover is capable of compressing the elastic pad to form a seal between the at least one protrusion structure and the waterproof groove. With the aforementioned design, the waterproof structure is capable of preventing water or dust from permeating into the portable electronic apparatus through any expansion interface of the housing.

In order to achieve another objective of the present invention, the portable electronic apparatus of the present invention comprises a housing and at least one aforementioned waterproof structure. The housing further comprises an upper housing, a lower housing, and a waterproof pad. The upper housing is combined with the lower housing, and the waterproof pad is disposed in the joint of the upper housing and the lower housing. With the aforementioned design, the whole of the portable electronic apparatus of the present invention is impermeable to dust and water.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
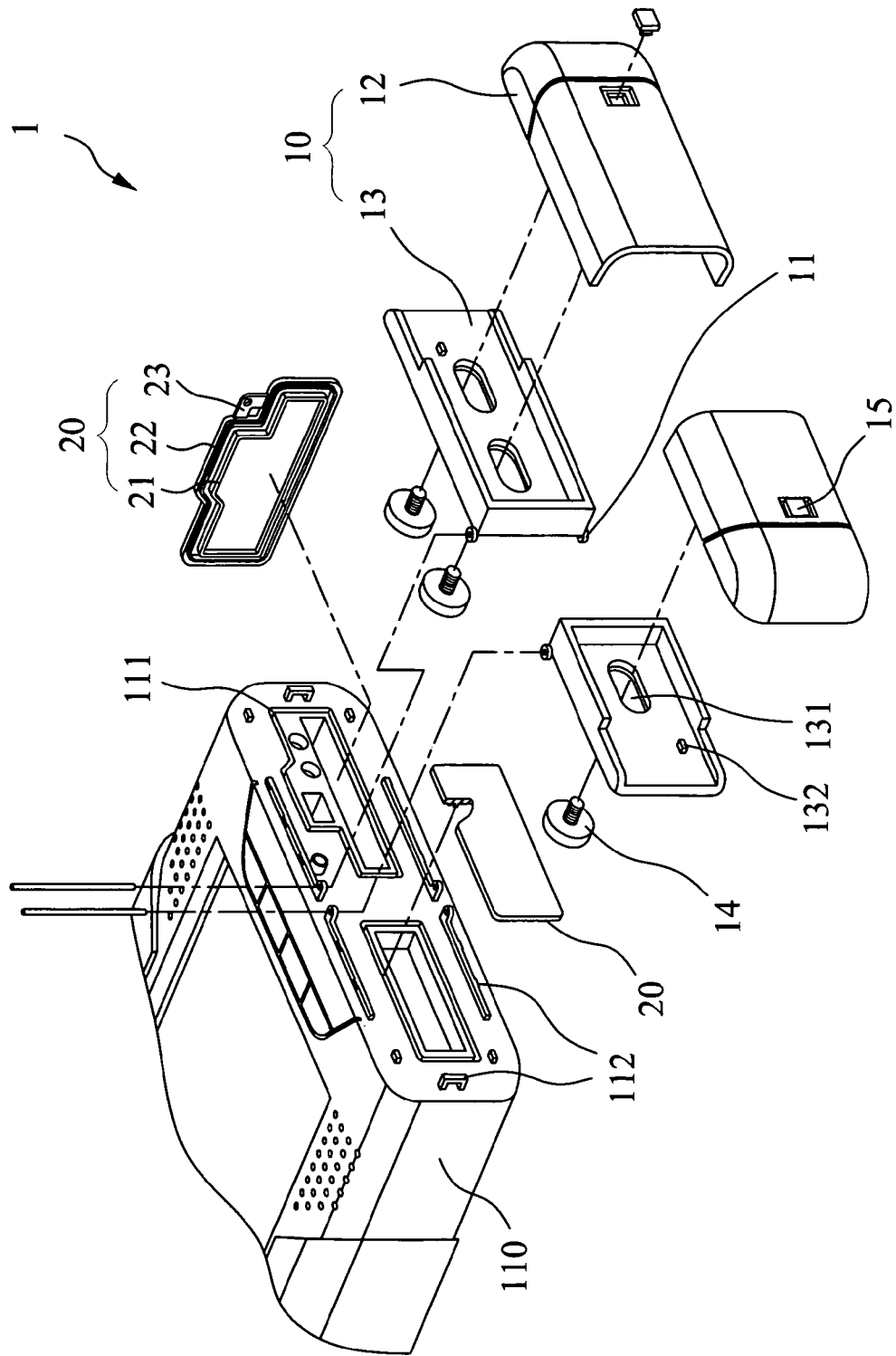
FIG. 1 is an exploded view of a waterproof structure according to the present invention.
Figure 2:
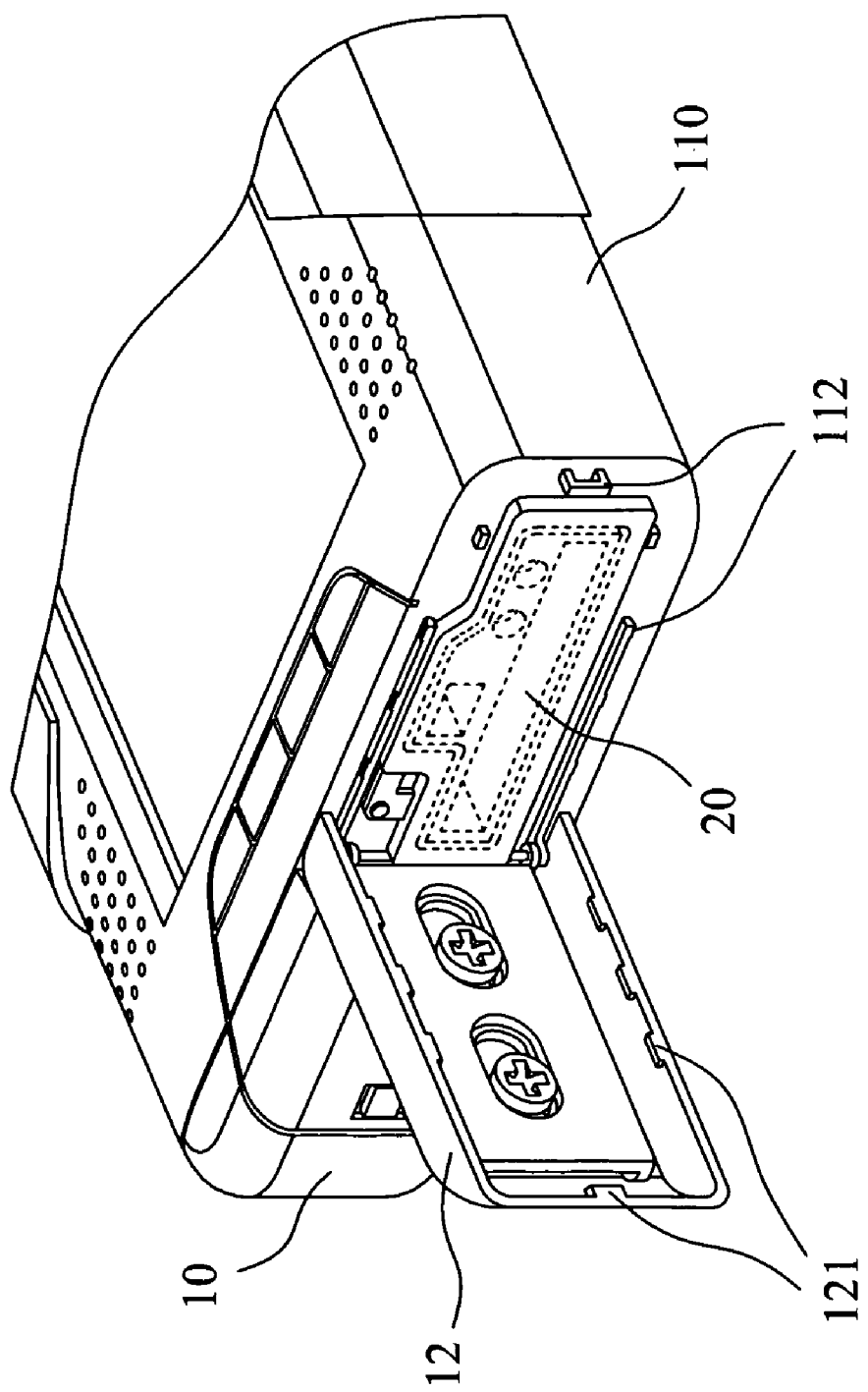
FIG. 2 is a perspective view of a waterproof structure according to the present invention.

Please refer to FIG. 1 and FIG. 2. FIG. 1 is an exploded view of a waterproof structure according to the present invention. FIG. 2 is a perspective view of a waterproof structure according to the present invention. As shown in FIG. 1, the waterproof structure 1 for a housing 110 of a portable electronic apparatus of the present invention is capable of preventing water and dust from permeating into the interior of the housing 110, such that the waterproof structure 1 may protect the expansion interfaces (not shown) of the housing 110. The waterproof structure according to the present invention comprises a cover 10 and an elastic pad 20. The cover 10 comprises a pivot portion 11, and the cover 10 is connected to the housing 110 via the pivot portion 11 such that the cover 10 is capable of rotating in relation to the housing 110. The elastic pad 20 comprises at least one protrusion structure 21 capable of inserting into a waterproof groove 111 on the housing 110 corresponding to the protrusion structure 21. When the cover 10 is rotated to close the housing 110, the cover 10 is capable of compressing the elastic pad 20 to form a seal between the at least one protrusion structure 21 and the waterproof groove 111. With the aforementioned design, the at least one protrusion structure 21 may be inserted into the waterproof groove 111 to form a contact seal, and the compression of the elastic pad 20 may enhance the degree of compactness between the elastic pad 20 and the housing 110. In the embodiment, the elastic pad 20 is silicone material, but other equivalent compressible materials are suitable. The elastic pad 20 may be also fastened via the at least one protrusion structure 21 inserting into the waterproof groove 111. The amount of the at least one protrusion structure 21 of the elastic pad 20 may be increased for different requirements or designs of the apparatus, and the amount of the waterproof groove 111 disposed on the housing 110 may be altered to correspond to the amount of the at least one protrusion structure 21.

Furthermore, the elastic pad 20 further comprises at least one auxiliary protrusion structure 22, and the height of the at least one auxiliary protrusion structure 22 is lower than the height of the at least one protrusion structure 21. The at least one auxiliary protrusion structure 22 is disposed outside the at least one protrusion structure 21. When the elastic pad 20 is compressed, the at least one protrusion structure 21 is inserted into the waterproof groove 111 to form the contact seal, and the at least one auxiliary protrusion structure 22 may contact the housing 110 to form another contact seal. The amount of the at least one auxiliary protrusion structure 22 of the elastic pad 20 may also be increased for different requirements or designs of the apparatus. The elastic pad 20 further comprises a fastening structure 23 for fastening the elastic pad 20 on the housing 110 or the cover 10. One end or one side of the elastic pad 20 may be fastened via the fastening structure 23 to prevent the loss of the elastic pad 20 when the cover 10 is opened. When the waterproof structure 1 is placed on the expansion interface, a user is capable of rapidly attaching and detaching the elastic pad 20, which determines whether the expansion interface is used. The elastic pad 20 may be fastened on different places for different designs of the apparatus. In this embodiment, the elastic pad 20 is partially fastened on the housing 110, but the elastic pad 20 may also be fastened on the cover 10 or the pivot portion 11.

The cover 10 of the waterproof structure 1 of the present invention further comprises an exterior cover 12 and an interior cover 13, and the exterior cover 12 is slidably combined with the interior cover 13. In this embodiment, the exterior cover 12 is combined with the interior cover 13 via at least one screw element 14, and the at least one screw element 14 may slide via a predetermined sliding hole 131 of the interior cover 13. As shown in FIG. 2, the exterior cover 12 of the cover 10 further comprises a fastening member 121 corresponding to an auxiliary fastening member 112 on the housing 110. The fastening member 121 can provide an auxiliary fastening effect when the cover 10 closes to the housing 110. The cover 10 further comprises a locking device 15 for locking the cover 10. When the expansion interface is unused, the cover 10 corresponding to the expansion interface may be locked to prevent the cover 10 from being opened unintentionally. In this embodiment, the locking device 15 is a moveable fastener. The exterior cover 12 may be unopenable when a fastener (not shown) which is connected to the locking device 15 is locked to a corresponding protrusion 132 disposed on the interior cover 13. The locking device 15 may be a push-button fastener, but other equivalent fastening structures are suitable.

Figure 3A:
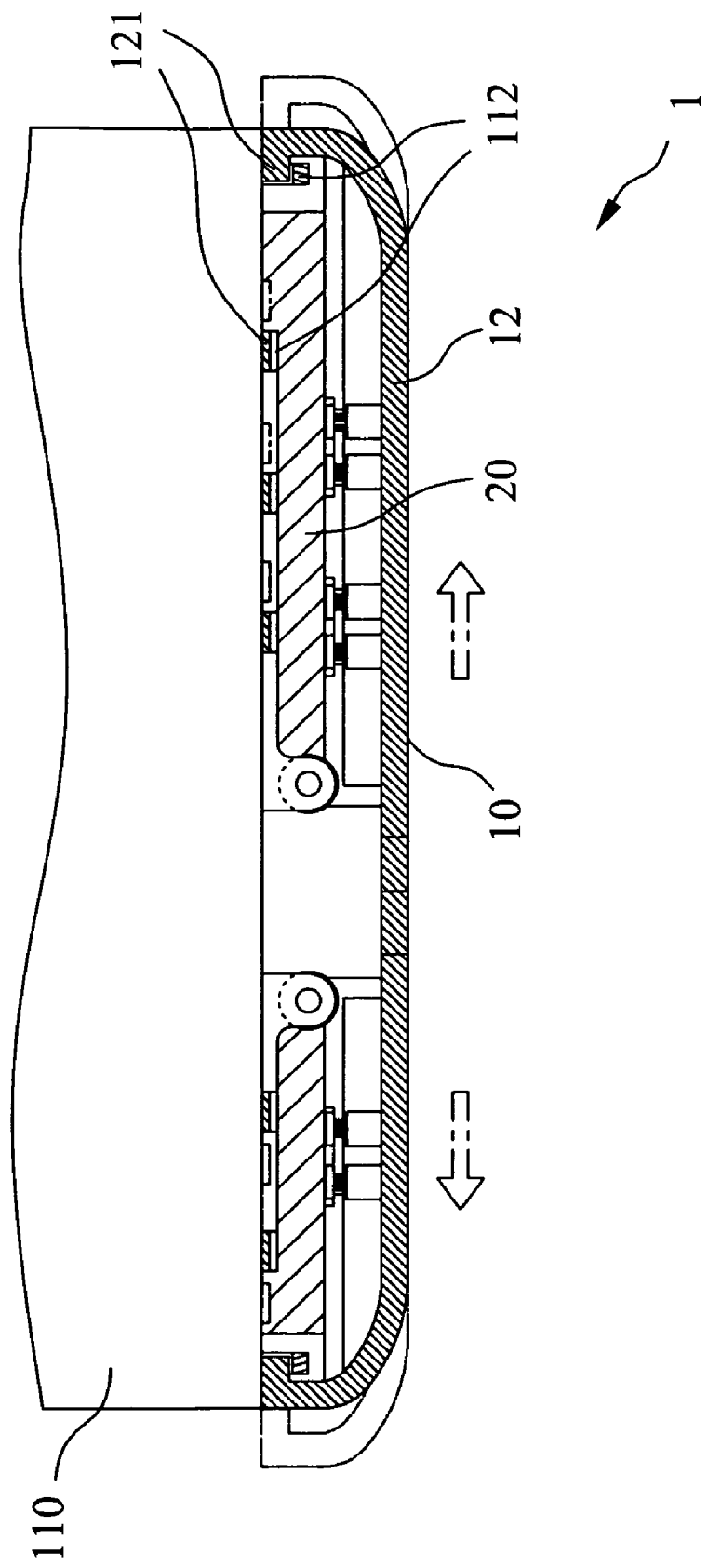
FIGS. 3(A) and 3(B) are schematic drawings of the use of a waterproof structure according to the present invention.
Figure 3B:
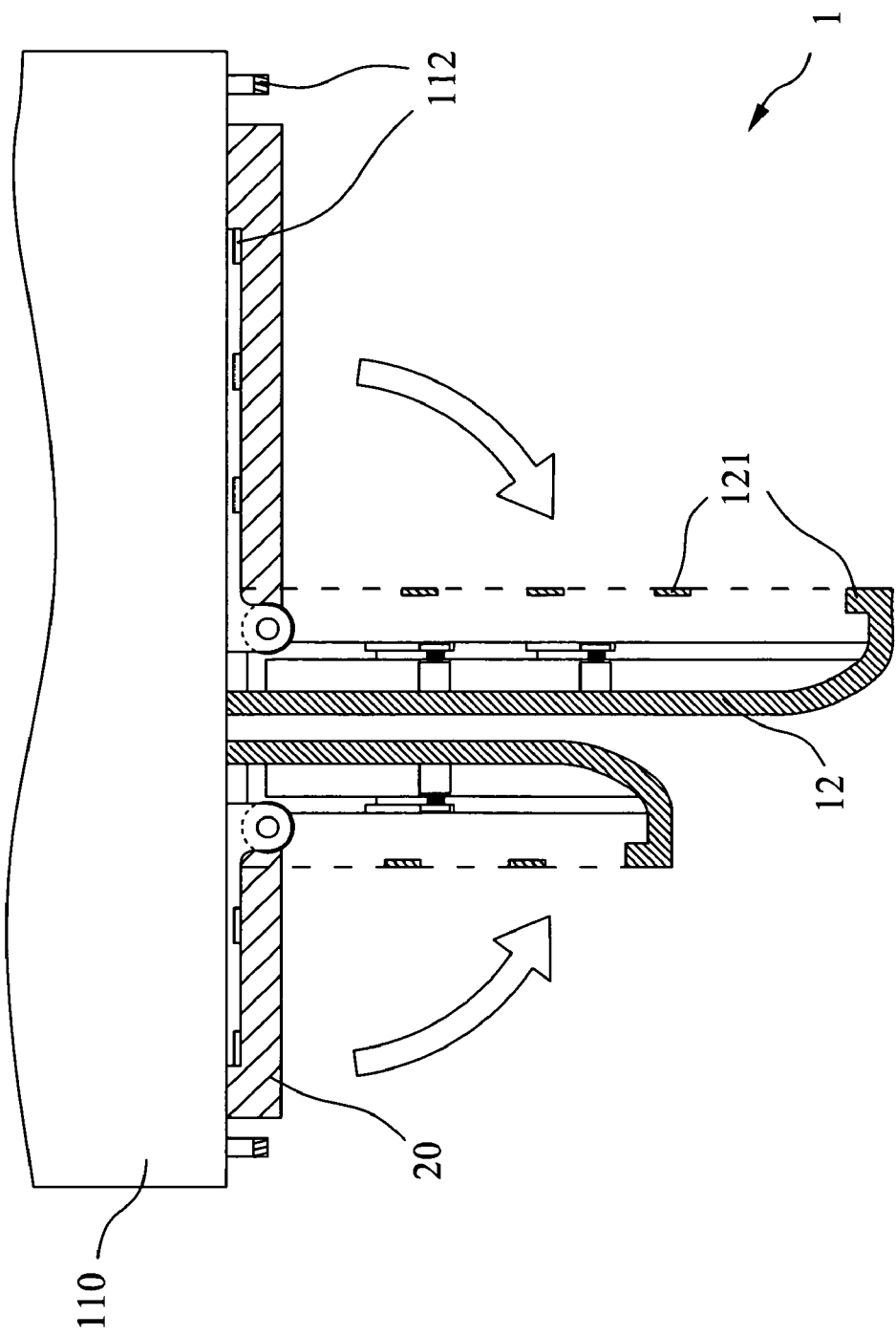

Please refer to FIGS. 3(A) and 3(B). FIG. 3(A) and FIG. 3(B) are schematic drawings of the use of a waterproof structure according to the present invention. As shown in FIGS. 3(A) and 3(B), in this embodiment, the waterproof structure 1 is a two-section openable type. When the waterproof structure 1 is opened, the exterior cover 12 may be slid straight outward a short distance. The fastening member 121 of the exterior cover 12 may thus be released from the restriction of the auxiliary fastening member 112 disposed on the housing 110 so that the elastic pad 20 may generate a recover elasticity to push the cover 10 away from the housing 110. Then the cover 10 is capable of rotating a suitable angle corresponding to the housing 110 to detach the elastic pad 20. Inversely, when the user wants to close the waterproof structure 1, he may first attach the elastic pad 20 on the housing 110 and rotate the cover 10 to close the housing 110. The elastic pad 20 is thus compressed to form a seal. Then he may slide the exterior cover 12 inward and fasten the fastening member 121 of the exterior cover 12 via the auxiliary fastening member 112 of the housing 110 to restrict the motion of the cover 10.

Figure 4:
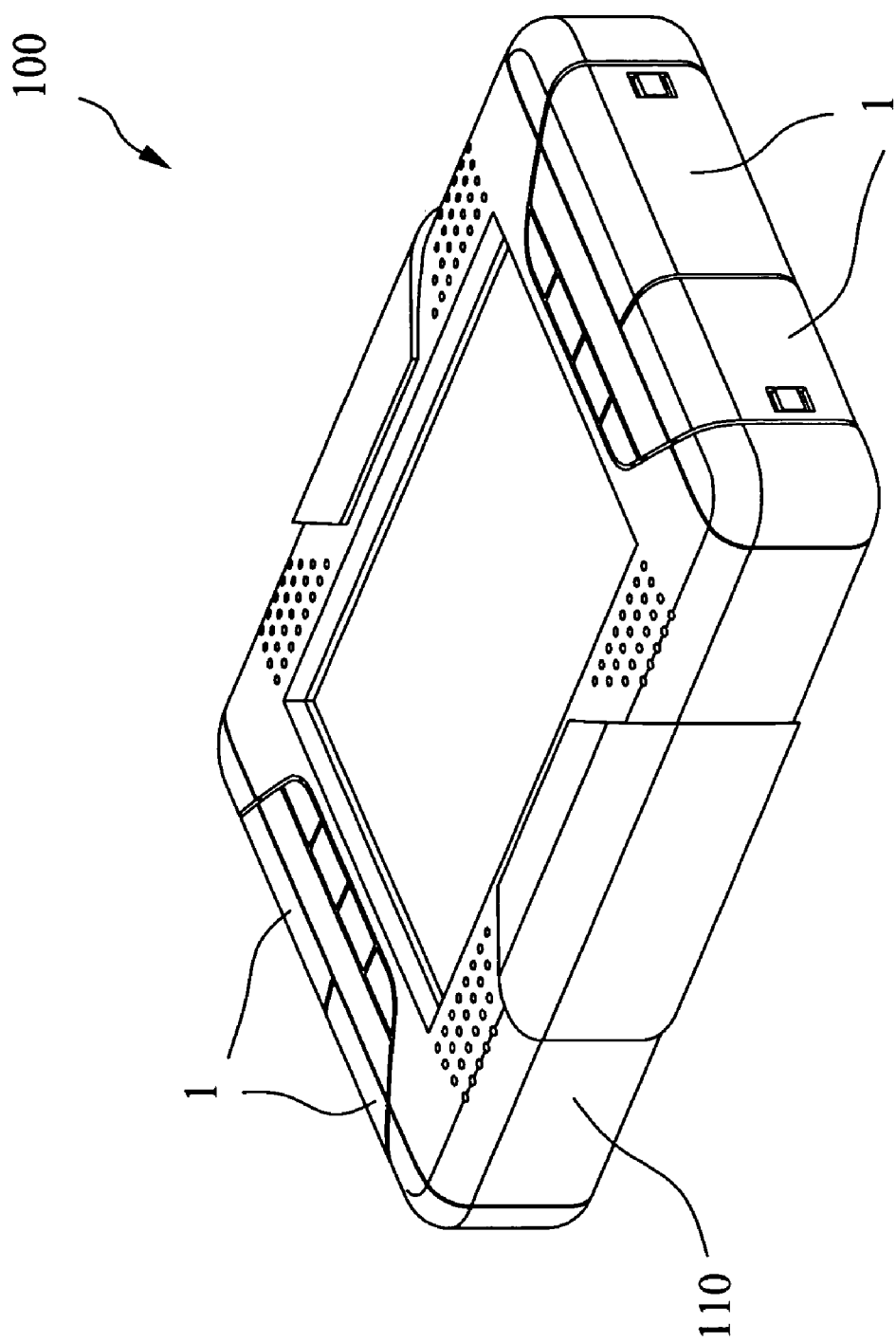
FIG. 4 is a perspective view of a portable electronic apparatus according to the present invention.

Please refer to FIG. 4. FIG. 4 is a perspective view of a portable electronic apparatus according to the present invention. As shown in FIG. 4, the portable electronic apparatus 100 of the present invention comprises a housing 110 and at least one aforementioned waterproof structure 1. The two sides of the housing 110 comprise at least one expansion interface (not shown), and the at least one waterproof structure 1 is disposed correspondingly on the at least one expansion interface to be impermeable to dust and water. In this embodiment, the portable electronic apparatus 100 is an ultra mobile personal computer, but other portable electronic apparatuses, such as a notebook computer, a mobile phone or a GPS device, are suitable.

Figure 5:
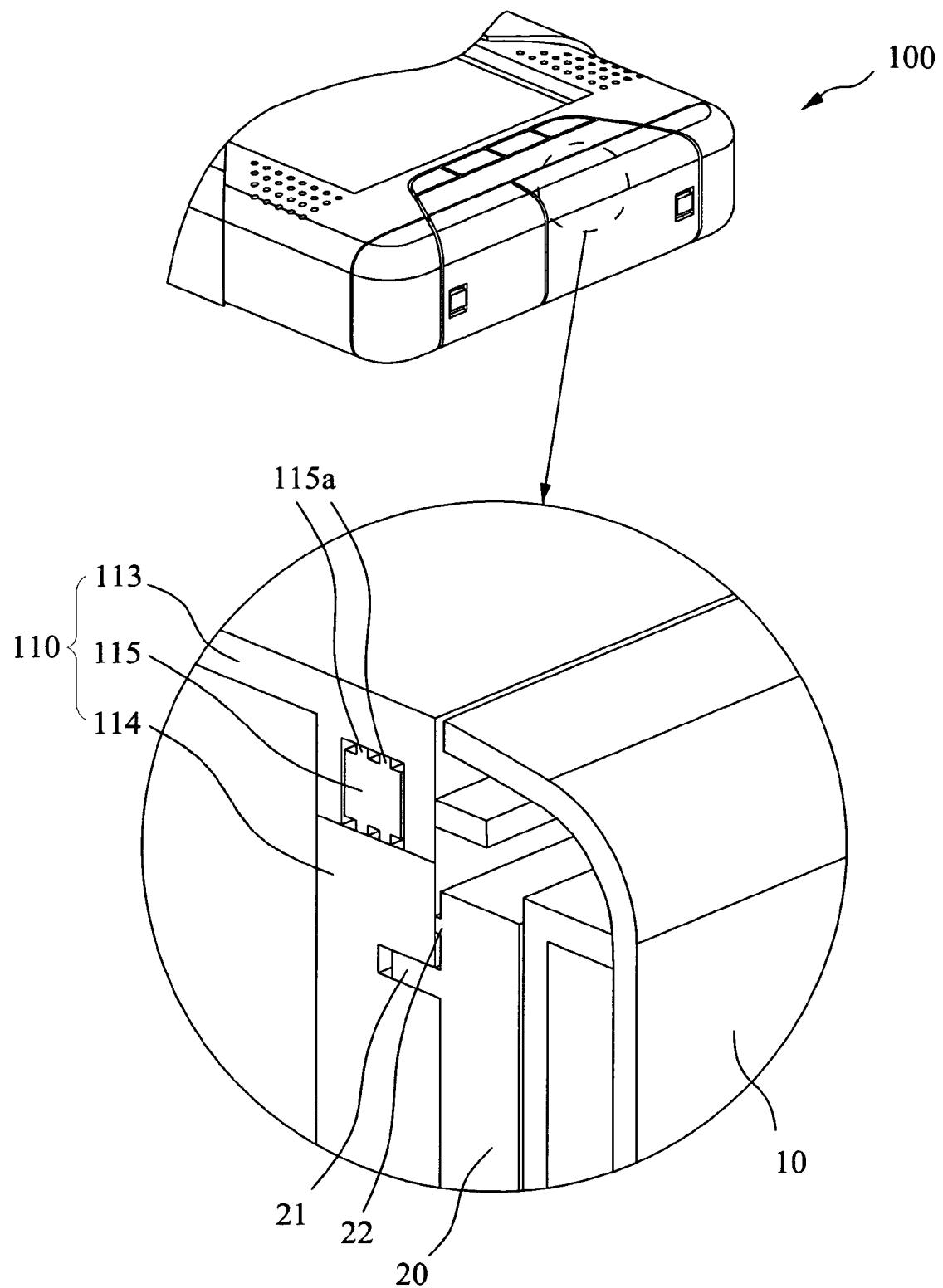
FIG. 5 is a partial cross-sectional drawing of a portable electronic apparatus according to the present invention.

Please refer to FIG. 5. FIG. 5 is a partial cross-sectional drawing of a portable electronic apparatus according to the present invention. As shown in FIG. 5, the portable electronic apparatus 100 of the present invention further comprises an upper housing 113, a lower housing 114, and a waterproof pad 115. The upper housing 113 is combined with the lower housing 114, and the waterproof pad 115 is disposed in the joint of the upper housing 113 and the lower housing 114. However, the housing 110 of the portable electronic apparatus 100 may be combined with a plurality of housing portions. The waterproof pad 115 is capable of being disposed in the joints of each of the two housing portions to form a waterproof seal. Furthermore, the waterproof pad 115 comprises at least one protrusion structure 115a. When the upper cover 113 combines with the lower cover 114 to compress the waterproof pad 115, the at least one protrusion structure 115a may connect to the upper cover 113 and the lower cover 114 to form contact seals. The amount of the at least one protrusion structure 115a of the waterproof pad 115 may be increased for different requirements or designs of the apparatus.

Although the present invention has been explained in relation to its preferred embodiment, it is to be understood that many other possible modifications and variations can be made without departing from the spirit and scope of the invention as hereinafter claimed.

What is claimed is:

1. A waterproof structure for a housing of a portable electronic apparatus, the waterproof structure comprising:
    a cover comprising a pivot portion, the cover being connected to the housing via the pivot portion such that the cover is capable of rotating in relation to the housing; and
    an elastic pad comprising at least one protrusion structure and at least one auxiliary protrusion structure, the at least one protrusion structure being capable of inserting into a waterproof groove on the housing corresponding to the protrusion structure, the at least one auxiliary protrusion structure being disposed outside of and around the at least one protrusion structure, and the height of the at least one auxiliary protrusion structure being lower than the height of the at least one protrusion structure;
    wherein, when the cover is rotated to close the housing, the cover is capable of compressing the elastic pad to form a seal between the at least one protrusion structure and the waterproof groove.

2. The waterproof structure as claimed in claim 1, wherein the cover further comprises an exterior cover and an interior cover, the exterior cover being slidingly combined with the interior cover.

3. The waterproof structure as claimed in claim 2, wherein the exterior cover further comprises a fastening member corresponding to an auxiliary fastening member on the housing.

4. The waterproof structure as claimed in claim 1, wherein the cover further comprises a locking device for locking the cover.

5. The waterproof structure as claimed in claim 1, wherein the elastic pad further comprises a fastening structure for fastening the elastic pad on the housing or on the cover.

6. A portable electronic apparatus comprising:

a housing; and at least one waterproof structure, the waterproof structure comprising:

a cover comprising a pivot portion, the cover being connected to the housing via the pivot portion such that the cover is capable of rotating in relation to the housing; and an elastic pad comprising at least one protrusion structure and at least one auxiliary protrusion structure, the at least one protrusion structure being capable of inserting into a waterproof groove on the housing corresponding to the protrusion structure, the at least one auxiliary protrusion structure being disposed outside of and around the at least one protrusion structure, and the height of the at least one auxiliary protrusion structure being lower than the height of the at least one protrusion structure;

wherein, when the cover is rotated to close the housing, the cover is capable of compressing the elastic pad to form a seal between the at least one protrusion structure and the waterproof groove.

7. The portable electronic apparatus as claimed in claim 6, wherein the cover further comprises an exterior cover and an interior cover, the exterior cover being slidingly combined with the interior cover.

8. The portable electronic apparatus as claimed in claim 7, wherein the exterior cover further comprises a fastening member corresponding to an auxiliary fastening member on the housing.

9. The portable electronic apparatus as claimed in claim 6, wherein the cover further comprises a locking device for locking the cover.

10. The portable electronic apparatus as claimed in claim 6, wherein the elastic pad further comprises a fastening structure for fastening the elastic pad on the housing or on the pivot portion.

11. The portable electronic apparatus as claimed in claim 6, wherein the housing further comprises an upper housing, a lower housing, and a waterproof pad, the upper housing being combined with the lower housing, and the waterproof pad being disposed in the joint of the upper housing and the lower housing.

12. The portable electronic apparatus as claimed in claim 11, wherein the waterproof pad comprises at least one protrusion structure.

13. The portable electronic apparatus as claimed in claim 6, wherein the portable electronic apparatus is an ultra mobile personal computer.

* * * * *